US005767708A

United States Patent [19]

Groeneveld et al.

[11] Patent Number: 5,767,708

[45] Date of Patent: Jun. 16, 1998

[54] CURRENT INTEGRATOR CIRCUIT WITH CONVERSION OF AN INPUT CURRENT INTO A CAPACITIVE CHARGING CURRENT

[75] Inventors: Dirk W. J. Groeneveld, Nijmegen; Eise J. Dijkmans, Eindhoven; Hendrikus J. Schouwenaars, Groenewoudseweg; Cornelis A. A. Bastiaansen, Nijmegen, all of Netherlands

[73] Assignee: U.S. Philips Corporation, New York, N.Y.

[21] Appl. No.: 675,657

[22] Filed: Jul. 3, 1996

[30] Foreign Application Priority Data

Jul. 5, 1995 [EP] European Pat. Off. .............. 95201832

[51] Int. Cl.⁶ ........................ H03K 4/06

[52] U.S. Cl. ........................ 327/132; 327/103

[58] Field of Search ........................ 327/103, 53, 66, 327/131, 132, 336, 538, 540, 541, 543, 546; 323/312, 315, 316

[56] References Cited

U.S. PATENT DOCUMENTS

| | | | |
|---|---|---|---|
| 4,803,441 | 2/1989 | Noro | 330/257 |
| 5,120,984 | 6/1992 | Klatser | 327/132 |
| 5,140,282 | 8/1992 | Van Mil et al. | 330/267 |
| 5,359,298 | 10/1994 | Abe | 331/2 |
| 5,387,882 | 2/1995 | Shoofs | 327/131 |
| 5,418,501 | 5/1995 | Schoofs et al. | 327/132 |
| 5,483,151 | 1/1996 | Yamashita | 327/538 |

*Primary Examiner*—Timothy P. Callahan
*Assistant Examiner*—My-Trang Nu Ton
*Attorney, Agent, or Firm*—Leroy Eason

[57] ABSTRACT

A current integrator for generating an output voltage (Vo) in response to an input current (Ii) to be integrated. The input current is applied to an integration capacitor via a current-current converter. This enables one end of the integration capacitor to be connected to a fixed voltage and to be implemented by means of a MOS transistor which occupies a comparatively small area. A further area reduction is possible by making the current gain (K) of the current-current converter smaller than 1.

10 Claims, 3 Drawing Sheets

CURRENT INTEGRATOR CIRCUIT WITH CONVERSION OF AN INPUT CURRENT INTO A CAPACITIVE CHARGING CURRENT

BACKGROUND OF THE INVENTION

1. Field of the Invention

The invention relates to a current integrator for generating an output voltage in response to an input current to be integrated, comprising: an input terminal for receiving the input current; an integration capacitor; charging means for charging the integration capacitor in response to the input current; and an output terminal coupled to an electrode of the integration capacitor at which the output voltage is produced.

2. Description of the Related Art

Such a current integrator is shown in FIG. 1 and is generally known from handbooks, application notes etc. The charging means comprise an operational amplifier 2, which has its inverting input connected to the input terminal 4 for receiving the input current Ii to be integrated and having its non-inverting input connected to a reference voltage source 6 which supplies a reference voltage Vr relative to signal ground. Owing to the high voltage gain of the operational amplifier 2 the voltage difference between the inverting input and the non-inverting input is small, as a result of which the voltage at the input terminal 4 is also equal to the reference voltage Vr. The output of the operational amplifier 2 is at the output terminal 8 connected to an electrode 10 of an integration capacitor 12 which has its other electrode 14 connected to the inverting input of the operational amplifier 2. Owing to the high input impedance of the inverting input the current Ii to be integrated flows almost wholly into the integration capacitor 12, as a result of which the output voltage Vo at the output terminal 8 changes.

This known current integrator has various drawbacks. The integration capacitor 12 is comparatively difficult to realize on an integrated circuit. The voltage across the integration capacitor 12 is not exactly known and, moreover, it may become equal to zero volts. This means, for example, that it is not possible for the capacitance between gate and channel of an MOS transistor to be used as a capacitor. Instead special constructions are necessary such as improper use of a PMOS transistor in the accumulation mode, in which the gate-source voltage is smaller than the threshold voltage and electrons accumulate underneath the gate, instead of in the inversion mode, in which a channel is formed. Another possibility is to use capacitances between metal layers, but that requires a large area of the integrated circuit. The output voltage Vo should be processed by means of a circuit referred to the reference voltage Vr, because the current integrator is also referred to this voltage. This requires a differential circuit with a comparatively large number of components.

SUMMARY OF THE INVENTION

It is an object of the invention to provide a current integrator which is easier to fabricate on an integrated circuit. To this end a current integrator of the type defined in the opening paragraph is characterized in that the charging means comprise a current-current converter having a first current terminal coupled to the input terminal to receive the input current and having a second current terminal coupled to said electrode of the integration capacitor to supply to the integration capacitor an output current proportional to the input current.

FIG. 2 illustrates the principle such a current integrator. The input current Ii is applied to the integration capacitor 12 via the current-current converter 16, the input terminal 4 being held at the desired reference voltage Vr by means of a reference voltage source 18. The current-current converter 16 supplies an output current Io to the second current terminal 20, which current is proportional to the input current Ii which flows in the first current terminal 22. One side of the integration capacitor 12 may now be connected to a supply voltage, which enables the use of a capacitor formed by a MOS transistor, which occupies a comparatively small area.

An embodiment of the current integrator in accordance with the invention is characterized in that the ratio between the output current of the current-current converter and the input current is smaller than 1. A ratio smaller than 1 allows the use of a smaller capacitance value to obtain the same effect for a given voltage excursion across the integration capacitor 12. This saves additional area.

A practical embodiment of a current integrator in accordance with the invention is characterized in that the current-current converter comprises: a differential amplifier having an output, a non-inverting input connected to receive a reference voltage, and an inverting input coupled to the first current terminal; a first transistor having a control electrode coupled to the output of the differential amplifier, and having a main current path; a current mirror having an input branch coupled to the first current terminal via the main current path of the first transistor; a first bias current source coupled to the first current terminal to supply a first bias current to the first current terminal; and a second bias current source coupled to the second current terminal to supply a second bias current to the second current terminal.

The differential amplifier and the first transistor provide a low impedance at the first current terminal and keep the first current terminal at the reference voltage. The current mirror reflects the input current in attenuated or non-attenuated form, to the second current terminal, which is coupled to the integration capacitor and the output terminal. The first and the second bias current sources provide a quiescent current through the input branch and the output branch of the current mirror and permit a bidirectional input current.

If the ratio between the currents of the first bias current source and the second bias current source is not approximately equal to the current transfer ratio of the current mirror there will be an output current to the integration capacitor even when the input current is zero and so there will be an offset in the output voltage. This is undesirable in many fields of use. In order to preclude this, an embodiment of the integrator circuit in accordance with the invention is characterized in that the second bias current source comprises: a second transistor having a control electrode and having a main current path of which one electrode is coupled to the second current terminal; a first switch connected between the control electrode of the second transistor and said electrode of the main current path of the second transistor; and the current-current converter further comprises: a second switch connected between the first current terminal and the input terminal; a third switch connected between said electrode of the integration capacitor and the second current terminal; and control means for closing the first switch and opening the second and the third switch during a first period and for opening the first switch and closing the second and the third switch during a second period following the first period.

The second bias current is replaced by a calibrated current source, which is calibrated by temporarily arranging the second transistor as a diode by means of the first switch, the input terminal being decoupled from the first current terminal by means of the second switch, and the integration capacitor being decoupled from the second current terminal by means of the third switch. If desired, calibration may be repeated at regular intervals depending on the rate at which the charge on the control electrode of the second transistor leaks away.

BRIEF DESCRIPTION OF THE DRAWINGS

These and other aspects of the invention will now be described and elucidated with reference to the accompanying drawings, in which.

In these Figures parts having the same function or purpose bear the same reference numerals.

DESCRIPTION OF THE PREFERRED EMBODIMENTS

Figure 1:
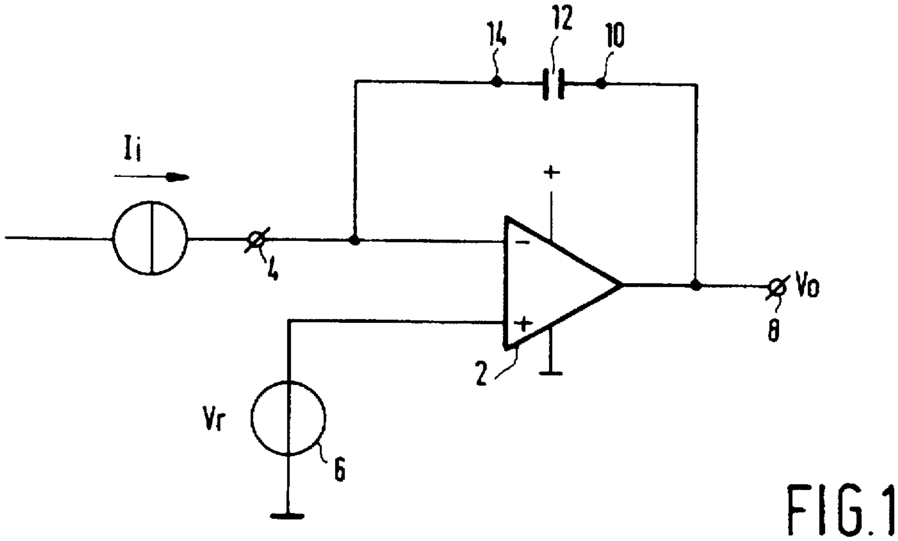
FIG.1 PRIOR ART
FIG. 1 shows a prior-art current integrator.
Figure 2:
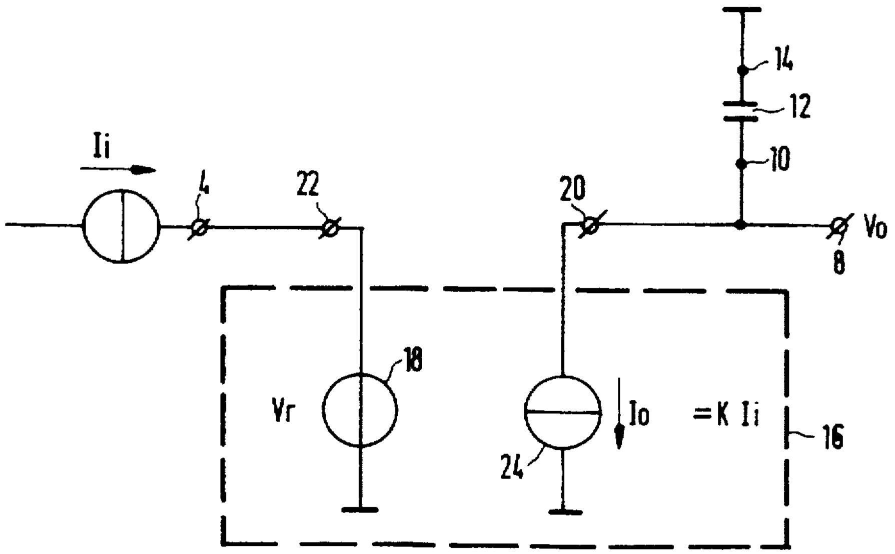
FIG. 2 shows the basic circuit diagram of a current integrator in accordance with the invention.

FIG. 2 shows the basic circuit diagram of a current integrator in accordance with the invention. The current integrator comprises a current-current converter 16 having a first current terminal 22 connected to an input terminal 4 for receiving an input current Ii to be integrated. By means of a reference voltage source 18 the operating voltage at the first current terminal 22 is kept equal to a reference voltage Vr relative to signal ground. The current-current converter 16 also comprises a controllable current source 24, which supplies an output current Io to a second current terminal 20, said output current being proportional to the input current Ii. The proportionality factor or current gain is K, so that Io=K*Ii. The current integrator further comprises an integration capacitor 12 having an electrode 10 connected to an output terminal 8 and having a further electrode connected to a fixed voltage, in the present case earth. The second current terminal 20 of the current-current converter 16 is connected to the output terminal 8, so that an output voltage Vo becomes available by charging or discharging the integration capacitor 12 with the output current Io from the controllable current source 24.

Since the integration capacitor 12 has one electrode connected to a fixed voltage it can be implemented by a MOS transistor, which occupies a small area, for example a PMOS transistor if the fixed voltage is the positive supply voltage. The source, drain and backgate of this PMOS transistor are then connected to the positive supply voltage and the gate of this PMOS transistor is connected to a voltage equal to positive supply voltage minus at least the threshold voltage $V_T$. If, in addition, the current gain K of the current-current converter 16 is selected to be smaller than unity a capacitance which is a factor K smaller can be used to obtain for the same voltage excursion across the integration capacitor 12. This saves additional area.

Figure 3:
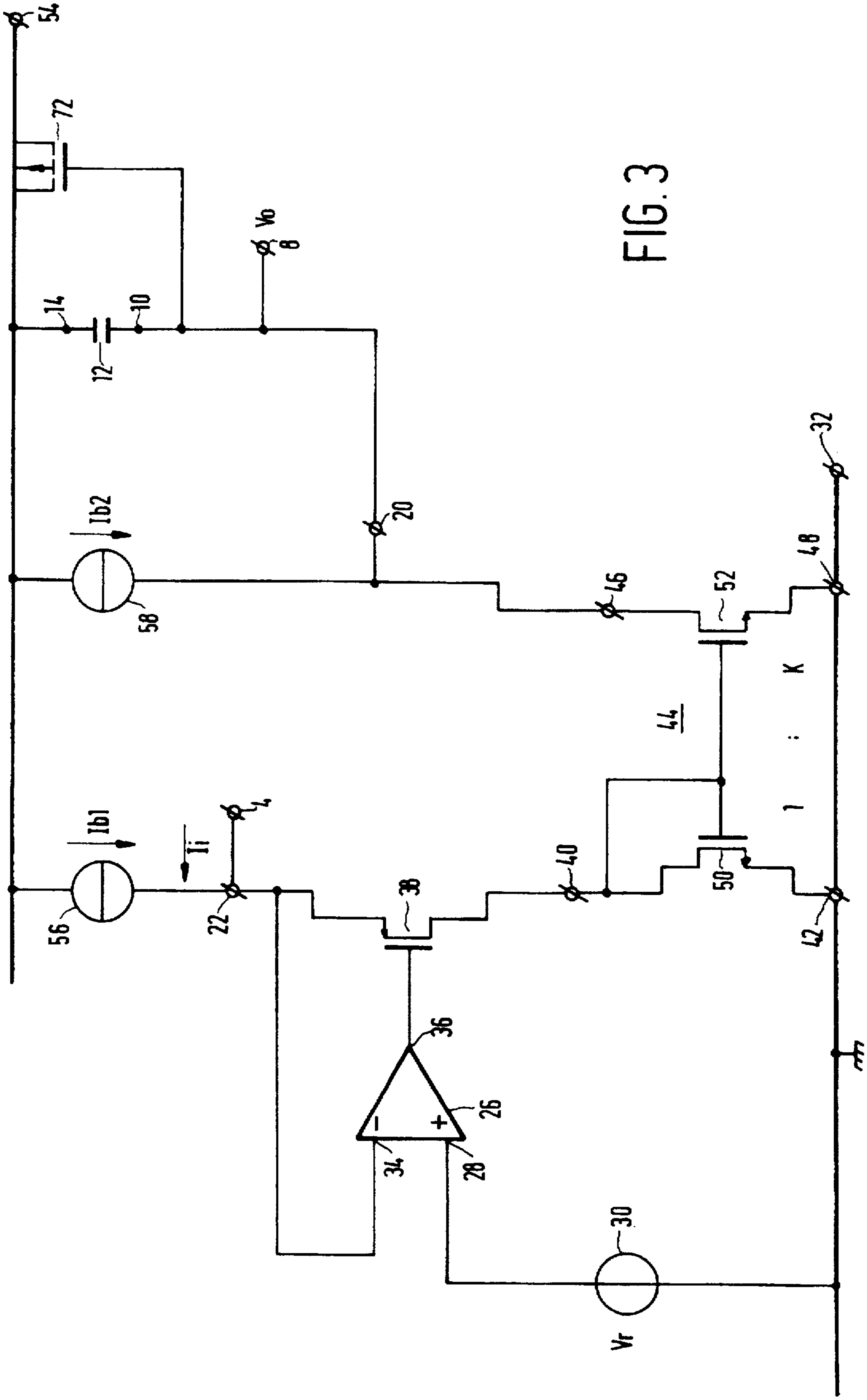
FIG. 3 shows a first variant of a current integrator in accordance with the invention.

FIG. 3 shows an embodiment of the current integrator of FIG. 2. A differential amplifier 26 has a non-inverting input 28 connected to a first supply terminal 32 via a reference voltage source 30, which supply terminal functions as signal ground. The inverting input 34 of the differential amplifier 26 is coupled to the first current terminal 22, which is again connected to the input terminal 4 to receive the input current Ii to be integrated. The output 36 of the differential amplifier 26 is connected to the control electrode or gate of a PMOS transistor 38, which has its source connected to the first current terminal 22 and which has its drain coupled to an input branch 40, 42 of a current mirror 44. The source and drain form the main current path of the PMOS transistor 38, which provides a current path between the first current terminal 22 and the input branch 40, 42 of the current mirror 44. The current mirror 44 has an output branch 46, 48 coupled to the second current terminal 20.

The current mirror 44 comprises, by way of example, two NMOS transistors 50 and 52, whose sources are connected to the first supply terminal 32, whose gates are connected to the drain of the NMOS transistor 50, the gate of the NMOS transistor 50 being connected to the drain of the PMOS transistor 38 and the drain of the NMOS transistor 52 being connected to the second current terminal 20. The current gain K of the current mirror 44 is determined, in known manner, by the geometry ratio of the NMOS transistors 50 and 52.

The integration capacitor 12 is connected between the output terminal 8 and a second supply terminal 54, to which a positive supply voltage is applied. The integration capacitor 12 may comprise a PMOS transistor 72, whose source, drain and backgate are connected to the supply terminal 54 and whose gate is connected to the output terminal 8. The output terminal 8 and the electrode 10 of the integration capacitor 12 are also connected to the second current terminal 20. The gate capacitance of the PMOS transistor 72 acts as a capacitor and may take the place of or may be arranged in parallel with the integration capacitor 12. A first bias current source 56 between the second supply terminal 54 and the first current terminal 22 supplies a first bias current Ib1 to the series arrangement of the main current path of the PMOS transistor 38 and the input branch 40, 42 of the current mirror 44. A second bias current source 58 between the second supply terminal 54 and the second current terminal 20 supplies a second bias current Ib2 to the output branch 46, 48 of the current mirror 44. The bias current sources 56 and 58 bias the current mirror 44 and enable a bidirectional drive of the input terminal. The bias currents Ib1 and Ib2 are in a ratio equal to the current gain K of the current mirror 44, i.e. Ib2=K*Ib1.

The differential amplifier 26, the PMOS transistor 38 and the reference voltage source 30 hold the first current terminal 22 at a fixed voltage Vr relative to signal ground and also provide a low impedance at the first current terminal 22. The sum Ii+Ib1 of the first bias current Ib1 and the input current Ii flows to the input branch 40, 42 of the current mirror via the main current path of the PMOS transistor 38. A current K*(Ii+Ib1), which has been attenuated by a factor K, flows through the output branch 46, 48 to the second current terminal 20. Since Ib2=K*Ib1, a current K*Ii will flow in the integration capacitor 12 and an output voltage Vo will be available at the output terminal 8.

Figure 4:
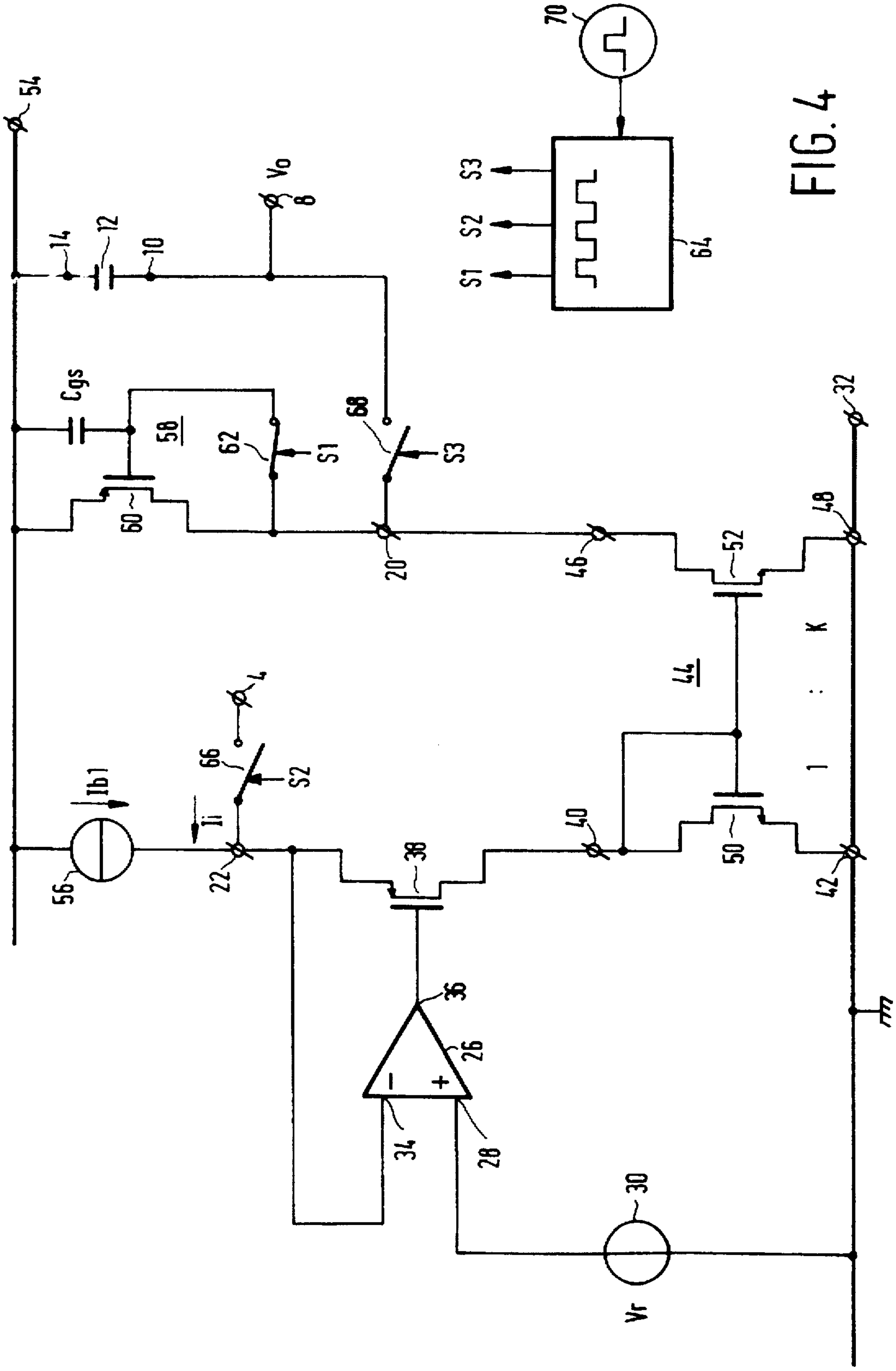
FIG. 4 shows a second variant of a current integrator in accordance with the invention.

If Ib2 is not equal to K*Ib1 an offset current will flow in the integration capacitor 12 in the case of an input current Ii equal to 0. FIG. 4 shows an embodiment which precludes this offset current. The second bias current source is a calibrated current source with a PMOS transistor 60 having its source connected to the second supply terminal 54 and its drain to the second current terminal 20. The gate of the PMOS transistor 60 may be connected to the drain of the PMOS transistor 60 by means of a first switch 62 under control of a switching signal S1 from control means 64. Furthermore, a second switch 66 is arranged between the input terminal 4 and the first current terminal 22, controlled by a second switching signal S2 from the control means 64, and a third switch 68 is arranged between the second current terminal 20 and the node between the integration capacitor 12 and the output terminal 8, which third switch is controlled by a third switching signal S3 from the control means 64. During calibration of the PMOS transistor 60 the first switch 62 is closed and the second and the third switch 66 and 68 are opened by means of suitable switching signals S1, S2 and S3. Now only a bias current Ib1 flows through the input branch 40, 42 of the current mirror 44. The current in the output branch 46, 48, which has been attenuated or amplified by a factor K, flows wholly through the diode-connected PMOS transistor 60, producing a gate-source voltage to match this current. After the first switch 62 has been opened and the second and the third switch 66 and 68 have been closed by suitable switching signals, S1, S2 and S3 the circuit is ready for use. The gate-source voltage built up in the PMOS transistor 60 is preserved in the internal gate-source capacitance Cgs of this transistor. However, for this purpose an external capacitor (not shown) may be connected to the gate of the PMOS transistor 60, if required. Since the gate-source capacitance Cgs is ultimately discharged by leakage currents, calibration should be repeated at regular intervals. For this purpose the control means further include a clock pulse generator 70, which ensures that recalibration is effected at regular intervals.

The embodiment shown in FIG. 4 is particularly suitable for use in digital-to-analog converters and switched capacitor filters which effect time-discrete signal processing.

FIGS. 3 and 4 show embodiments comprising MOS transistors. However, these transistors may be replaced by bipolar transistors, in which case drain, source and gate should read emitter, collector and base. The base is the control electrode of a bipolar transistor and the main current path is the path between the emitter and the collector. The switches 62, 66 and 68 preferably comprise MOS switching transistors, which are known to those skilled in the art. The control means 64 can be implemented by means of known digital techniques for the generation of suitable switching signals S1, S2 and S3.

We claim:

1. A current integrator circuit for generating an output voltage ($V_o$) in response to an input current ($I_i$) to be integrated, comprising: an input terminal (4) for receiving the input current; capacitor means having a first electrode (10) and a second electrode (14); charging means for charging said capacitor means in response to the input current, thereby producing at said first electrode (10) a charge voltage which constitutes said output voltage ($V_o$) and an output terminal (8) coupled to said first electrode (10); wherein said charging means comprises a current-current converter (16) having a first current terminal (22) coupled to said input terminal (4) to receive the input current and having a second current terminal (20) coupled to said first electrode (10) of the capacitor means to supply to the capacitor means a charging current ($I_o$) which is proportional by a factor (K) to the input current; and further wherein said capacitor means comprises a first transistor which is a MOS transistor.

2. A current integrator circuit as claimed in claim 1, wherein the current-current converter (16) comprises: a differential amplifier having an output, a non-inverting input connected to receive a reference voltage (Vr), and an inverting input coupled to said second current terminal (22); a 2 transistor (38) having a control electrode coupled to the output of the differential amplifier and having a main current path; a current mirror (44) having an input branch (40, 42) and an output branch (46, 48), the input branch being coupled to the first current terminal (22) via the main current path of the second transistor (38); a first bias current source (56) coupled to the first current terminal (22) to supply thereto a first bias current ($I_{b1}$), and a second bias current source (58) coupled to the second current terminal (20) to supply thereto a second bias current ($I_{b2}$).

3. A current integrator circuit as claimed in claim 2, wherein the second bias current source (58) comprises: a third transistor (60) having a control electrode and having a main current path coupled to the second current terminal (20); a first switch (62) connected between the control electrode of the third transistor (60) and the main current path thereof; and further wherein the current-current converter (16) further comprises: a second switch (66) connected between the first current terminal (22) and the input terminal (4); a third switch (68) connected between said first electrode (10) of the capacitor means and the second current terminal (20); and control means (64) for closing the first switch (62) and opening the second (66) and third (68) switches during a first period and for opening the first switch (62) and closing the second (66) and third (68) switches during a second period following the first period.

4. A current integrator circuit as claimed in claim 3, wherein the third transistor is a MOS transistor.

5. A current integrator circuit as claimed in claim 3, wherein the control means include means (70) for periodically repeating the first and the second period.

6. A current integrator circuit as claimed in claim 2, wherein the current-current converter (16) further comprises a first supply terminal (32) coupled to the input branch and the output branch of the current mirror (44), and a second supply terminal (54) coupled to the first bias current source (56) and the second bias current source (58) and to the second electrode (14) of the capacitor means.

7. A current integrator circuit as claimed in claim 2, wherein the current mirror (44) has a current transmission ratio smaller than 1 from the input branch to the output branch thereof.

8. A current integrator circuit as claimed in claim 2, wherein said factor (K) is less than 1.

9. A current integrator circuit as claimed in claim 8, wherein the current mirror (44) has a current transmission ratio smaller than 1 from the input branch to the output branch thereof.

10. A current integrator circuit as claimed in claim 1, wherein the factor (K) is less than 1.

* * * * *